(12) United States Patent
Parks

(10) Patent No.: US 7,075,129 B2
(45) Date of Patent: Jul. 11, 2006

(54) IMAGE SENSOR WITH REDUCED P-WELL CONDUCTIVITY

(75) Inventor: Christopher Parks, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 205 days.

(21) Appl. No.: 10/754,354

(22) Filed: Jan. 9, 2004

(65) Prior Publication Data
US 2005/0151056 A1 Jul. 14, 2005

(51) Int. Cl.
H01L 27/148 (2006.01)

(52) U.S. Cl. .................. 257/225; 257/232; 257/231; 438/48; 438/54

(58) Field of Classification Search .............. None
See application file for complete search history.

(56) References Cited

U.S. PATENT DOCUMENTS

| | | | |
|---|---|---|---|
| 5,286,990 A | 2/1994 | Hynecek | 257/247 |
| 5,438,211 A * | 8/1995 | Nakamura et al. | 257/239 |
| 5,736,756 A | 4/1998 | Wakayama et al. | 257/223 |
| 6,049,100 A | 4/2000 | Kawai et al. | 257/233 |
| 6,150,676 A | 11/2000 | Sasaki | 257/191 |
| 6,338,978 B1 | 1/2002 | Moon | 438/57 |

OTHER PUBLICATIONS

Parks et al., "Large Area Interline CCD With Low Dark Current," *Proceedings of the SPIE—The International Society For Optical Engineering SPIE-Int. Soc. Opt. Eng. USA*, vol. 5017, 2003, pp. 167-175.

* cited by examiner

*Primary Examiner*—Nathan J. Flynn
*Assistant Examiner*—Scott R. Wilson
(74) *Attorney, Agent, or Firm*—Peyton C. Watkins

(57) ABSTRACT

An image sensor includes a substrate of the first conductivity type; a channel of the first conductivity type that spans at least a portion of the substrate; a well of the second conductivity type that is positioned between the channel and substrate for a predetermined portion and that is not between the substrate and the channel for a predetermined portion all of which well is substantially continuous; and a connection to the well; wherein a resistance of the well not between the substrate and the channel is substantially equal to or greater than twenty five percent of a total resistance of the well between the channel and the substrate.

4 Claims, 3 Drawing Sheets

R1 > 0.25 (n) (R2)

IMAGE SENSOR WITH REDUCED P-WELL CONDUCTIVITY

FIELD OF THE INVENTION

The invention relates generally to the field of charge-coupled device type image sensors and, more particularly, to image sensors having reduced p-well conductivity.

BACKGROUND OF THE INVENTION

As shown in FIG. 1, prior art charge-coupled devices (CCD) 10 typically include a substrate 100 and a well 20 of the first conductivity type and buried channel 30 of the second conductivity type for the transfer of charge packets 40. A plurality of gates 50 is separated from the buried channel 30 by a thin insulating layer 60. For the purpose of illustration, the first conductivity type is p-type; the second conductivity type is n-type; and the CCD is of the two-phase type. The charge packets 40 are electrons flowing in the n-type buried channel 30. The opposite type of the electron charge packets 40 will be holes flowing in the p-type substrate or well 20.

Voltages applied to the gates 50 alter the potential energy within the buried channel 30 for the purpose of controlling the transfer of charge packets 40 through the charge-coupled device 10. The channel potential 45 in the buried channel 30 underneath each gate is plotted in FIG. 1. Additional p-type implants 35 are used to selectively alter the channel potential under the gates 50 for controlling the direction of charge packet 40 transfer.

If the CCD 10 is to be used as an imaging device, then the charge packets 40 transferred through the buried channel 30 were generated by photons. In the case of full frame type image sensors, the photoelectrons are generated directly in the CCD. In the case of interline transfer image sensors, the photoelectrons are generated in photodiodes adjacent to the CCD.

The gates 50 change voltage for the purpose of transferring charge packets 40 through the buried channel 30. The gates 50 are capacitive coupled to the p-well 20. A voltage change causes holes to flow in and out of the p-well 20 to the contact 110 at the end of the CCD 10. A view showing the p-well contacts 110 relative to the entire image sensor 130 is shown in FIG. 2. The image sensor 130 consists of a plurality of vertical CCD's 10 which transfer charge in parallel towards a serial horizontal CCD 120. The equivalent circuit is shown in FIG. 3. The capacitors C represent the coupling of the gates through the insulating layer to the p-well. The p-well has a resistance of R2 from one gate to the next along the direction of charge transfer. The final resistance between the p-well and the p-well contact 110 is represented as R1. In the case of a two-phase CCD, the gates are typically clocked as shown in FIG. 4. It is noted that when one gate has a voltage transition 91 the other gate has an equal but opposite voltage transition 92. The equally opposing voltage transitions only require holes to flow from one gate to its nearest neighboring gate through a resistance R2. As a result of the equally opposite voltage transitions, the voltage within the p-well is stable. In some cases, electron charge transfer requirements in the CCD channel requires non-equal voltage transitions on the gates as shown in FIG. 5. If V1 is held constant and only V2 is changed, then holes must flow from the p-well 20 (shown in FIG. 1) all of the way out of the CCD to (or from) the p-well contact 110. The resistive path of the p-well for the flow of holes can be extremely large. Especially in the case of very large image sensor containing thousands of gates. The p-well resistance could be many millions of Ohms. At the middle of the CCD, the p-well resistance is the sum total of all of the R2 resistances along the CCD channel and the final resistance from the CCD to the p-well contact R1. But for gates near the edge of the CCD, the p-well resistance is much smaller (the value of R1) since it is a short distance away from the p-well contact 10. This different resistances means the RC time constant will vary across the image sensor resulting in a non-constant voltage on the p-well. This is generally referred to as p-well bounce.

The p-well bounce can cause problems with the photodiodes adjacent to the CCD in an interline CCD. The charge capacity of the photo-diode is determined by the relative voltage difference between the p-well 20 and the substrate 100. If the p-well bounces, it has a non-uniform voltage resulting in photodiodes near the p-well contacts 110 having a different charge capacity than photodiodes far away from the p-well contacts 110. The different charge capacities result in non-uniform photo-response patterns in an image sensor.

The prior art has focused primarily on reducing the values of R1 and R2 to make the RC time constant as small as possible. The prior art, such as in U.S. Pat. No. 5,736,756, discloses providing a p-well contact at every pixel site which would eliminate R1 and reduce R2 to an insignificant value. Contact is made with a low resistance metal thus eliminating the p-well bounce. Identical schemes are described in U.S. Pat. Nos. 6,3338,978 and 5,286,990. The drawback of adding a contact at each pixel site is significant manufacturing complexity and the contacts will act as a source of impurities contaminating the photodiodes and causing unwanted dark current generation.

U.S. Pat. No. 6,049,100 discloses adding additional p-well contacts between the vertical CCD and the horizontal CCD to reduce the p-well resistance. The drawback to this approach is that it only reduces the value of R1 and does nothing for the p-well located in the center of the image sensor (the value of R2). There is still a very large resistance from the center of the p-well to the additional p-well contacts.

Consequently, a need exists for a CCD that overcomes the above-described drawbacks.

SUMMARY OF THE INVENTION

The present invention is directed to overcoming one or more of the problems set forth above. Briefly summarized, according to one aspect of the present invention, the invention resides in an image sensor having a substrate of the first conductivity type; a channel of the first conductivity type that substantially spans the substrate; a well of the second conductivity type that is positioned between the channel and substrate for a predetermined portion and that is not between the substrate and the channel for a predetermined portion all of which well is substantially continuous; and a connection to the well; wherein a resistance of the well not between the substrate and the channel is substantially equal to or greater than fifteen percent of a total resistance of the well between the channel and the substrate.

These and other aspects, objects, features and advantages of the present invention will be more clearly understood and appreciated from a review of the following detailed description of the preferred embodiments and appended claims, and by reference to the accompanying drawings.

Advantageous Effect of the Invention

The present invention has the following advantage of having a high resistance path between all of the CCD gates, center or edge, and the p-well contacts. A high resistance everywhere means that, when the voltages of the CCD gates are changed in a non-equal uncompensated fashion, the entire p-well will couple equally to the gates everywhere. Thus the non-uniform photodiode charge capacity problem is significantly reduced.

DETAILED DESCRIPTION OF THE INVENTION

Before discussing the present invention in detail, it is instructive to generally note some of the distinguishing features of the present invention. In this regard, the prior art has primarily focused on improving the conductivity of the p-well in order to completely eliminate or reduce the p-well bounce. The preferred embodiment of the present invention is to do the opposite of the prior art. In other words, there is an increase of the resistance to the p-well. Instead of making the p-well resistance everywhere low, the present invention makes the p-well resistance everywhere equally high. The present invention also removes the p-well contacts along the end of the CCD, and places only a few p-well contacts 200 along the sides of the image sensor as will be described in detail hereinbelow. By doing this, the present invention provides a high resistance path between all of the CCD gates, center or edge, and the p-well contacts. A high resistance everywhere means that, when the CCD gate voltages are changed in a non-equal uncompensated fashion, the entire p-well will couple substantially equally to the gates everywhere. Thus, the non-uniform photodiode charge capacity drawback of the prior art is significantly reduced.

Figure 1:
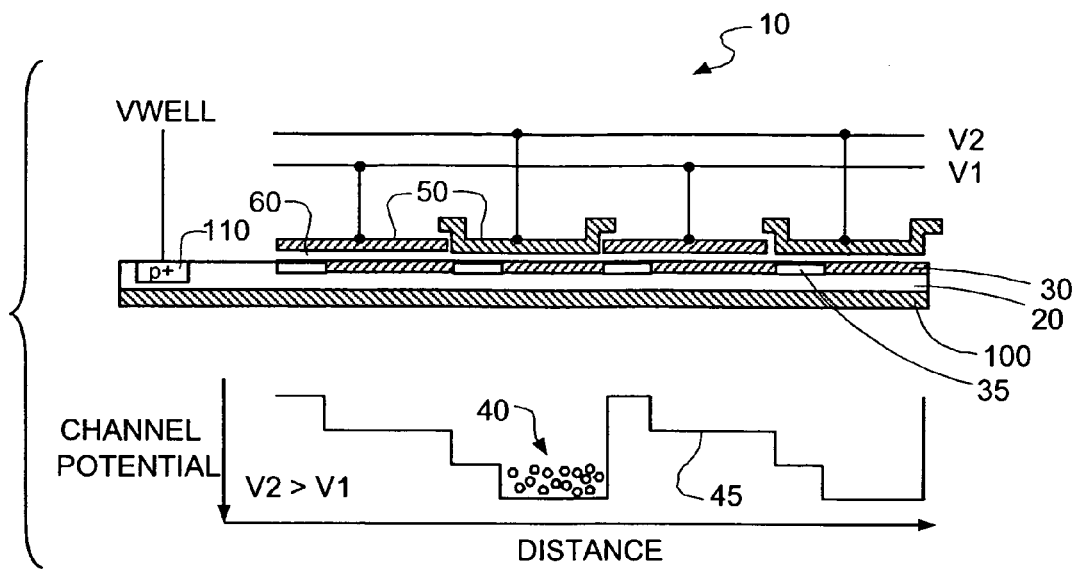
FIG. 1 is a cross sectional, side view of a prior art image sensor.
Figure 2:
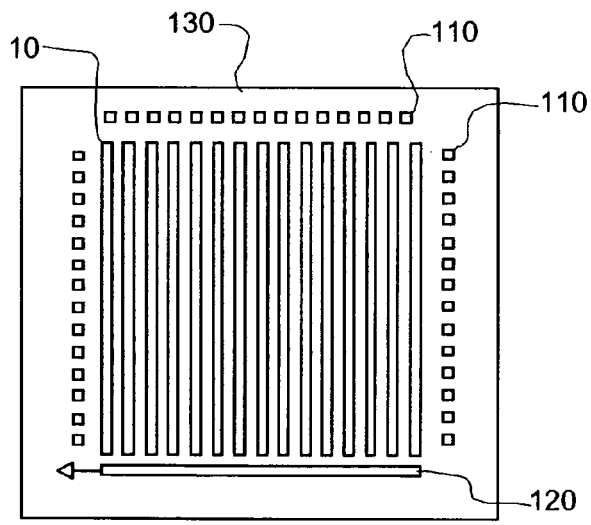
FIG. 2 is a top view of prior art FIG. 1.
Figure 3:
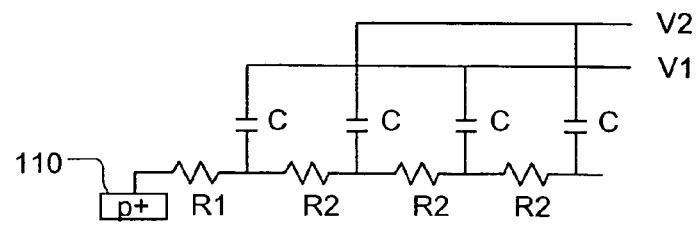
FIG. 3 is a schematic electrical representation of prior art FIG. 1.
Figure 4:
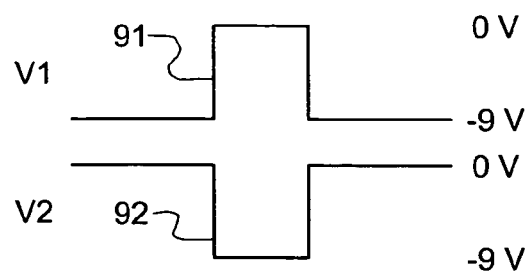
FIG. 4 is a typical prior art clock diagram for a typical image sensor.
Figure 5:
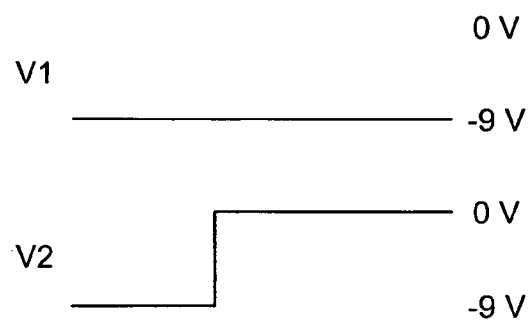
FIG. 5 is also a typical prior art clock diagram for a typical image sensor.
Figure 6:
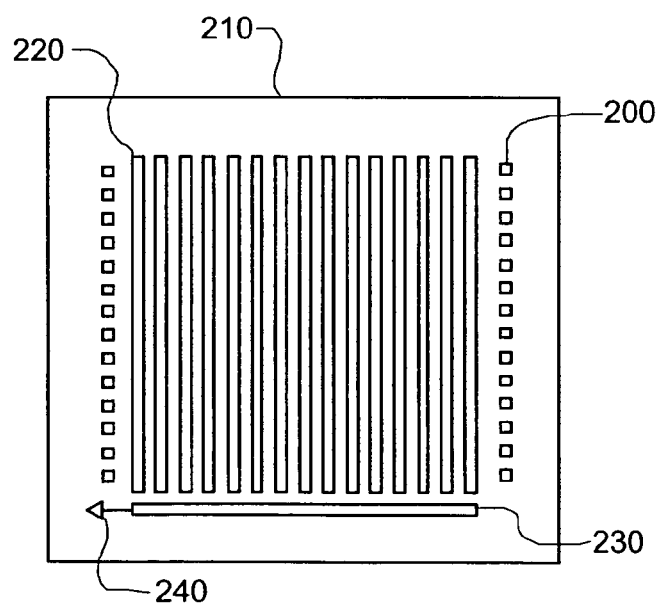
FIG. 6 is a top view of the charge-coupled device type image sensor of the present invention.

Referring to FIG. 6, there is shown a top view of the image sensor 210 of the present invention. The sensor 210 includes a plurality of charge-coupled devices 220 arranged in an array. The sensor may be, for example, an interline or full frame type image sensor. In then case of interline, a photodiode will be adjacent each CCD for receiving the incident light that is converted into a charge packet representing the captured image. The CCD's then receive the charge packets and transfer to a horizontal readout device for eventual processing. In the case of full frame, the CCD's capture the incident light that is converted into a charge and then the CCD's transfer the charge packets to the horizontal readout for processing. In either case, the charge packets are eventually transferred to a horizontal readout device 230 that passes the charge to an output amplifier 240 for eventual processing.

The sensor also includes a plurality of contacts 200 for receiving or supplying holes from or to the p-well of the sensor. The contacts 200 are arranged at a predetermined distance from the CCD's so that a desired higher resistance (relative to the prior art) is achieved. In the preferred embodiment, the contacts are arranged along the two vertical sides of the image sensor for achieving this desired resistance, although other arrangements are possible. It is noted that this distance is substantially longer, in relative terms, than the prior art for achieving the desired resistance.

Figure 7:
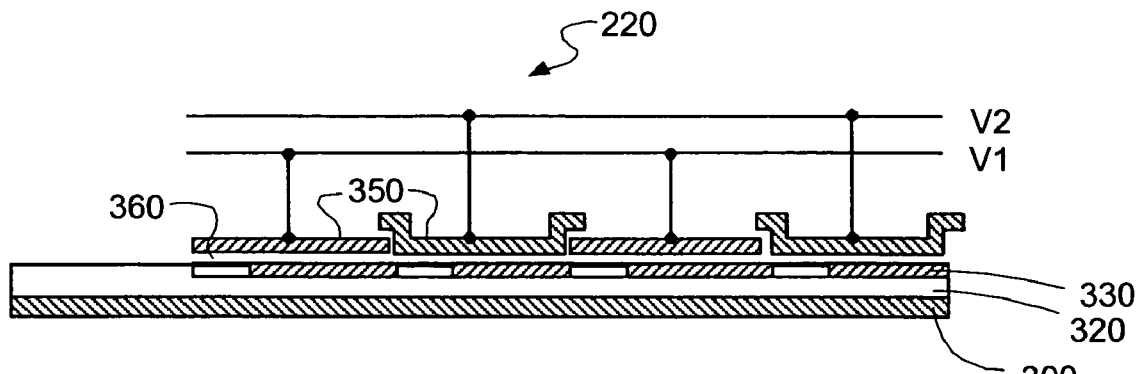
FIG. 7 is a cross-sectional view of FIG. 6.

Referring to FIG. 7, there is shown a cross-sectional view of the sensor of the present invention. The sensor includes a substrate 300 of a predetermined conductivity type, n-type in the preferred embodiment. A well 320 of another predetermined conductivity type, p-type in the preferred embodiment, is disposed spanning and covering the substrate 300. The contacts are disposed in the well, but they are not visible in FIG. 7 since they are preferably along the sides of the image sensor. A buried channel 330 of the predetermined conductivity type, preferably n-type, spans and covers a majority of the well for transporting the charge packets representing the image, as discussed hereinabove. An insulating layer 360 is disposed between the buried channel 330 and the gates 350 that are energized for selectively transporting charge packets through the buried channel 330.

Still referring to FIG. 7, holes flow in and out of the p-well from the contacts. It is noted that, since the contacts are in a spaced far away relationship from the CCD, the resistance of the well not covered by the gates is increased from the prior art that results in improved performance. Positioning the contacts far away from the CCD is only one way to increase the resistance. The p-type doping level may be adjusted to increase the resistance without moving the contacts. The objective of the invention is to introduce a high resistance such that when the CCD gate voltages are changed in a non-equal uncompensated fashion, the voltage drop along the p-well under the CCD channel will be less than the voltage drop from the end of the CCD to the p-well contact. Thus the non-uniform photodiode charge capacity drawback of the prior art is significantly reduced.

Figure 8:
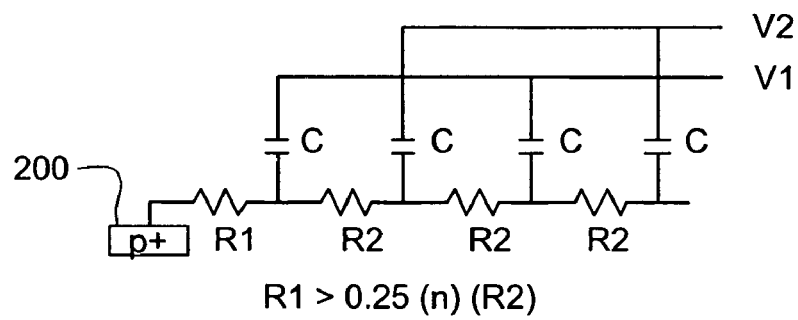
FIG. 8 is a schematic diagram in electrical representation of FIG. 6.

Referring to FIG. 8, there is shown a schematic diagram in electrical representation illustrating the resistance of the p-well not covered by the buried channel (R1) in relationship to the resistance of the well covered by the buried channel (R2). More specifically, the resistance of the well not between the substrate (R1) and the channel is substantially equal to or greater than twenty five percent of a total resistance (sum of all R2 resistors) of the well between the channel and the substrate. If n is the number of gates along the entire length of the CCD channel, then R1 would be greater than 0.25(n)(R2).

It is noted as well known in the art that the invention is also applicable to CCD's of the type with more than two-phases of gates.

Figure 9:
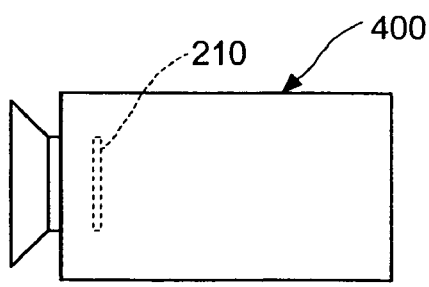
FIG. 9 is a digital camera for illustrating a preferred embodiment for the sensor of the present invention.

Referring to FIG. 9, there is a side view of a digital camera 400 for illustrating a preferred commercial embodiment for the sensor 210 of the present invention.

The invention has been described in detail with particular reference to certain preferred embodiments thereof, but it will be understood that variations and modifications can be effected within the spirit and scope of the invention.

PARTS LIST

10 CCD
20 well
30 buried channel
35 additional p-type implants
40 charge packets
45 channel potential
50 gates
60 thin insulating layer
91 voltage transition
92 equal but opposite voltage transition
100 substrate
110 contacts
120 CCD
130 image sensor
200 contacts
210 image sensor
220 CCD
230 horizontal read out device
240 output amplifier
300 substrate
320 well
330 buried channel
350 gates
360 insulating layer
400 digital camera

What is claimed is:

1. An image sensor comprising:
   (a) a substrate of the first conductivity type;
   (b) a channel of the first conductivity type that spans at least a portion of the substrate;
   (c) a well of the second conductivity type that is positioned between the channel and substrate for a predetermined portion, that spans a plurality of pixels and that is not between the substrate and the channel for a predetermined portion all of which well is substantially continuous; and
   (d) a connection to the well; wherein a resistance of the well not between the substrate and the channel is substantially equal to or greater than twenty five percent of a total resistance of the well between the channel and the substrate.

2. The image sensor as in claim 1, wherein the channel is a buried channel.

3. A camera comprising:
   an image sensor comprising:
   (a) a substrate of the first conductivity type;
   (b) a channel of the first conductivity type that substantially spans the substrate;
   (c) a well of the second conductivity type that is positioned between the channel and substrate for a predetermined portion, that spans a plurality of pixels and that is not between the substrate and the channel for a predetermined portion all of which well is substantially continuous; and
   (d) a connection to the well; wherein a resistance of the well not between the substrate and the channel is substantially equal to or greater than twenty five percent of a total resistance of the well between the channel and the substrate.

4. The camera as in claim 3, wherein the channel is a buried channel.

* * * * *